(12) United States Patent
Krizan et al.

(10) Patent No.: US 7,130,110 B2
(45) Date of Patent: Oct. 31, 2006

(54) TEMPERATURE CONTROL IN AN OPTICAL AMPLIFICATION SYSTEM

(75) Inventors: Paul A. Krizan, Sachse, TX (US); Kimberly C. Davis, Providence Village, TX (US); Steven Taliaferro, Plano, TX (US)

(73) Assignee: Sanmina-SCI Corporation, San Jose, CA (US)

( * ) Notice: Subject to any disclaimer, the term of this patent is extended or adjusted under 35 U.S.C. 154(b) by 0 days.

(21) Appl. No.: 11/086,691

(22) Filed: Mar. 21, 2005

(65) Prior Publication Data

US 2006/0087722 A1    Apr. 27, 2006

Related U.S. Application Data

(60) Provisional application No. 60/621,361, filed on Oct. 22, 2004.

(51) Int. Cl.
*H01S 3/13* (2006.01)
(52) U.S. Cl. .................... 359/337; 359/341.1
(58) Field of Classification Search ............... 359/337, 359/337.11, 341.4, 333, 337.1
See application file for complete search history.

(56) References Cited

U.S. PATENT DOCUMENTS 6,104,526 A * 8/2000 Kakui .................... 359/337
6,694,080 B1 * 2/2004 Dejneka et al. ............. 385/123
6,704,137 B1 * 3/2004 Hamada .................. 359/341.3
6,857,276 B1 * 2/2005 Finn et al. ................ 62/3.7

FOREIGN PATENT DOCUMENTS

JP    2003273447 A * 3/2002

OTHER PUBLICATIONS

Pliska, T., et al., *IEEE*, 139-140, (2001).

* cited by examiner

*Primary Examiner*—Mark Hellner
(74) *Attorney, Agent, or Firm*—Perkins Coie LLP

(57) ABSTRACT

Systems and methods for controlling temperature in an optical amplification system are provided. An optical amplification system comprises a pump laser, a multiplexer, an optical fiber, a temperature control device, and processing circuitry. The pump laser generates an optical pump signal. The multiplexer multiplexes the optical pump signal and an input optical signal to generate a multiplexed optical signal. The optical fiber receives the multiplexed optical signal. The temperature control device controls temperature within the optical amplification system based on a control signal. The processing circuitry determines whether to adjust the temperature of the optical amplification system and generates the control signal based on this determination.

42 Claims, 7 Drawing Sheets

TEMPERATURE CONTROL IN AN OPTICAL AMPLIFICATION SYSTEM

CROSS-REFERENCE TO RELATED APPLICATIONS

The present application claims the benefit and priority of U.S. provisional patent application Ser. No. 60/621,361, our reference PA2862PRV, filed Oct. 22, 2004 and entitled "Systems and Methods for Operating an Optical Amplifier Over an Extended Temperature Range," which is herein incorporated by reference.

BACKGROUND

1. Field of the Invention

The invention relates generally to optical amplification, and more particularly to temperature control in optical amplification.

2. Description of the Prior Art

Optical fibers are an excellent communication medium, e.g. in avionics, because optical fibers provide large bandwidth, are lightweight, and are immune to electromagnetic interference. In some environments such as the aircraft environment, some challenges for optical amplification system design exist that are not currently addressed in the communications markets. These challenges include the need for low power consumption and a wide operating temperature range.

Standard erbium doped fiber amplifiers (EDFAs) are designed for operation between 0° C. and 70° C. The erbium doped fiber amplifiers operate over this range using either uncooled pump lasers or pump lasers operated at a specific temperature, (e.g. 25° C.) through use of a thermoelectric cooler.

When an optical amplification system operates at a temperature outside of the standard temperature range, the optical amplification system can maintain output optical power and noise figure at the expense of power consumption, or the optical amplification system can minimize power consumption at the expense of output optical power and noise figure. If an uncooled pump laser is used to minimize power consumption, the optical amplification system cannot maintain the output optical power and noise figure over a wide temperature range. If a thermoelectric cooler is used to fix the pump temperature, the optical amplification system can maintain output optical power and noise figure, but the power consumption will increase.

FIG. 1 illustrates a graph of wavelength versus power for performance of a pump laser at different temperatures in the prior art. The wavelength output by a pump laser varies with the temperature of operation of the pump laser. This temperature-dependent variation limits the temperature range for operation of optical amplification systems using pump lasers. In order to hold the wavelength of a pump laser stable, the optical amplification system uses a fiber Bragg grating. The fiber Bragg grating will effectively lock the pump laser wavelength as long as the wavelength peak of the gain medium in the laser is close to the center wavelength of the fiber Bragg grating. The wavelength peak of the gain medium is fundamentally temperature dependent. Therefore, if the temperature of the gain medium is not controlled by using a temperature control device, such as a thermoelectric cooler, the gain medium wavelength will drift sufficiently far away from the fiber Bragg wavelength so as to cause the pump laser to "unlock" and lase at a frequency other than the desired one. Thus, one resulting problem is a dramatically reduced gain from the optical amplification system.

SUMMARY OF THE INVENTION

The present invention addresses the above problems by providing systems and methods for temperature control in an optical amplification system. An optical amplification system comprises a pump laser, a multiplexer, an optical fiber, a temperature control device, and processing circuitry. The pump laser generates an optical pump signal. The multiplexer multiplexes the optical pump signal and an input optical signal to generate a multiplexed optical signal. The optical fiber receives the multiplexed optical signal. The temperature control device controls temperature within the optical amplification system based on a control signal. The processing circuitry determines whether to adjust the temperature of the optical amplification system and generates the control signal based on this determination.

In further embodiments, the optical amplification system also comprises a management system. In some embodiments, the management system is further configured to monitor and control temperature of the optical amplification system. In some embodiments, the management system may also monitor the pump laser current, gain, or power consumption of the optical amplification system.

The advantages of the present invention are that the temperature inside an optical amplification system can be dynamically controlled, instead of being at either an ambient temperature or a fixed temperature. In some embodiments, the output optical power and the noise figure can be maintained over a wide range of temperatures while simultaneously keeping power consumption below a threshold.

DETAILED DESCRIPTION OF THE INVENTION

The embodiments discussed herein are illustrative of one example of the present invention. As these embodiments of the present invention are described with reference to illustrations, various modifications or adaptations of the methods and/or specific structures described may become apparent to those skilled in the art. All such modifications, adaptations or variations that rely upon the teachings of the present invention, and through which these teachings have advanced the art, are considered to be within the scope of the present invention. Hence, these descriptions and drawings should not be considered in a limiting sense, as it is understood that the present invention is in no way limited to only the embodiments illustrated.

Figure 1:
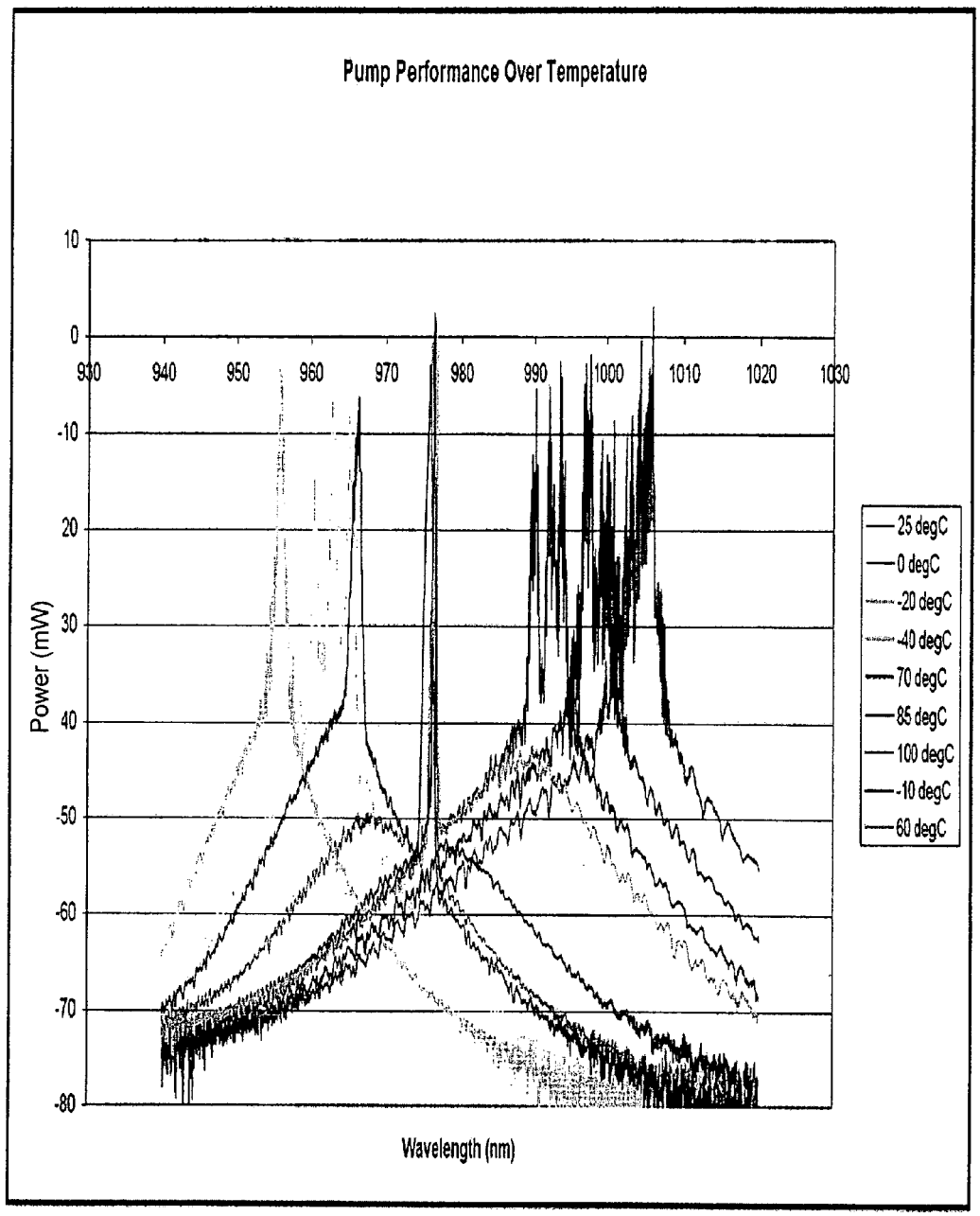
FIG. 1 is a graph of wavelength versus power that shows performance of a pump laser at different temperatures in the prior art.
Figure 2:
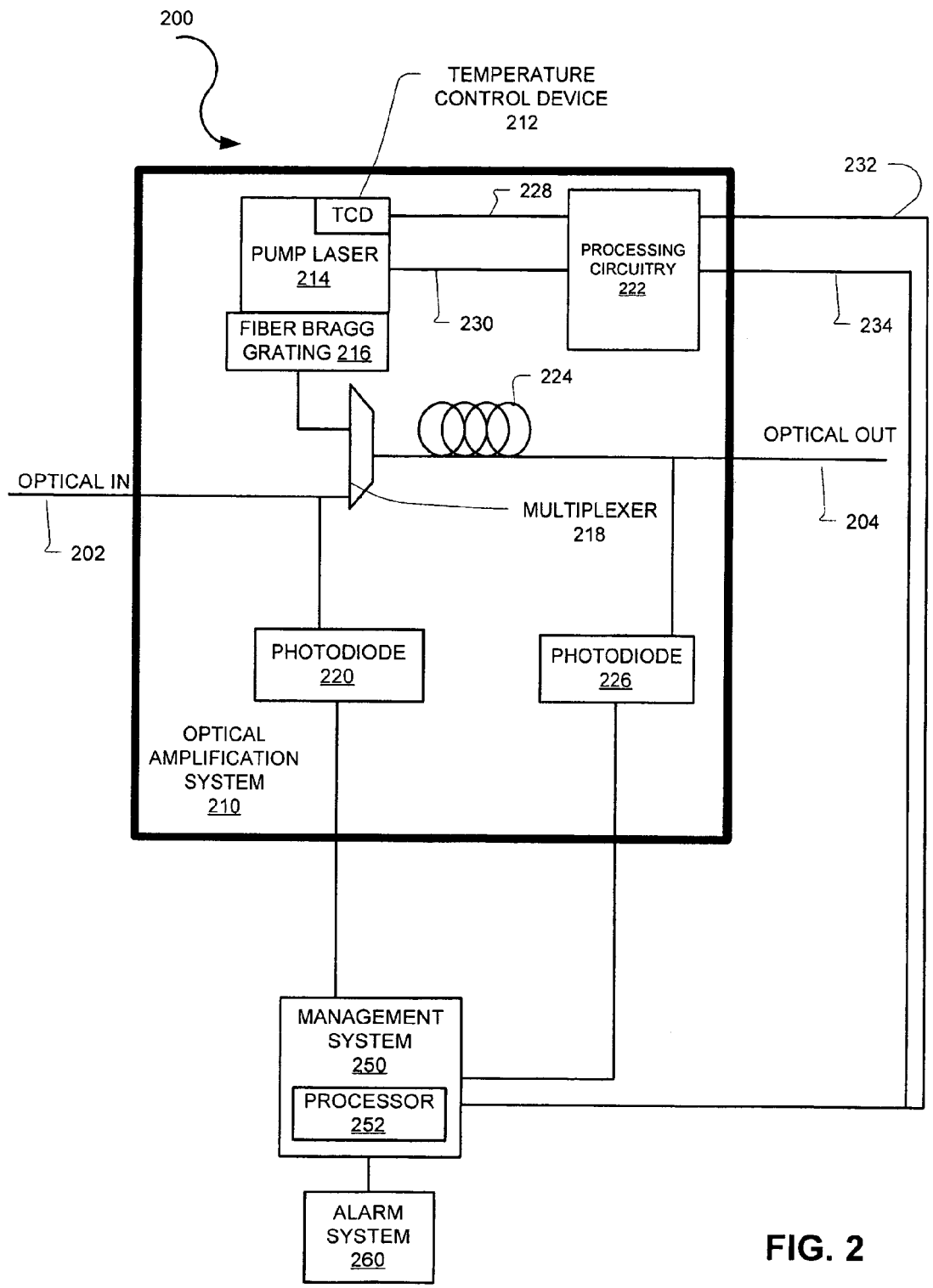
FIG. 2 is an illustration of an optical amplification system, a management system, and an alarm system in an exemplary embodiment of the invention.

FIG. 2 illustrates a system 200 for optical amplification in an exemplary embodiment of the invention. The system 200 comprises an optical input link 202, an optical output link 204, an optical amplification system 210, a temperature control link 232, a power control link 234, a management system 250, a processor 252, and an alarm system 260. The optical amplification system 210 comprises a pump laser 214, a temperature control device 212, a fiber Bragg grating 216, processing circuitry 222, a multiplexer 218, an optical fiber 224, a temperature control device link 228, a laser control link 230, a photodiode 220, and a photodiode 226.

The pump laser 214 is coupled to the temperature control device 212. In some embodiments, the temperature control device 212 may be inside the pump laser 214. In other embodiments, the temperature control device 212 is outside the pump laser 214 and coupled to the pump laser 214. The fiber Bragg grating 216 is coupled to the pump laser 214. The multiplexer 218 is coupled to the optical input link 202, the fiber Bragg grating 216, and the optical fiber 224. The photodiode 220 is coupled to the optical input link 202. The photodiode 226 is coupled to the optical output link 204. The temperature control device link 228 couples the temperature control device 212 and the processing circuitry 222. The laser control link 230 couples the pump laser 214 and the processing circuitry 222.

The management system 250 is coupled to the photodiodes 220 and 226 and to the alarm system 260. The management system 250 further comprises a processor 252. The temperature control link 232 is coupled to the processing circuitry 222 and the management system 250. The power control link 234 is coupled to the processing circuitry 222 and the management system 250.

The temperature control device 212 is any device configured to control temperature within the optical amplification system 210. In some embodiments, the temperature control device 212 comprises a thermoelectric cooler. In other embodiments, the temperature control device 212 comprises a resistive heater.

The pump laser 214 is any laser configured to generate an optical signal. In some embodiments, the pump laser 214 has a wavelength range of 960 nm to 990 nm. In other embodiments, the pump laser 214 has a wavelength range of 1400 nm to 1500 nm.

The fiber Bragg grating 216 is a device configured to lock the wavelength of the optical pump signal. In some embodiments, the fiber Bragg grating 216 is a doped optical fiber with a series of perturbations in the index of refraction created by exposure to ultraviolet light which causes the doped optical fiber to act as a wavelength filter.

The processing circuitry 222 is any processor, circuitry, or device configured to determine whether to adjust the temperature of the optical amplification system 210 and configured to generate a control signal based on this determination. In some embodiments, the processing circuitry 222 may communicate with the management system 250 via temperature control link 232 and power control link 234.

The multiplexer 218 is a device configured to multiplex optical signals. In some embodiments, the multiplexer 218 comprises a wavelength division multiplexer. In some embodiments, the optical fiber 224 is doped with rare earth elements. In some embodiments, the optical fiber 224 is doped with erbium. The photodiodes 220 and 226 convert optical signals to electrical signals and monitor optical signal intensity.

The temperature control link 232 links the processing circuitry 222 to the management system 250 and conveys information about the temperature control device 212. The power control link 234 links the processing circuitry 222 to the management system 250 and conveys information about the power of the pump laser 214.

The management system 250 is a system configured to manage operations of the optical amplification system 210. In some embodiments, the processor 252 interfaces with RS-232 software. In some embodiments, the alarm system 260 comprises an auditory alerter. In some embodiments, the alarm system 260 comprises a visual alerter. In some embodiments, the alarm system 260 comprises a logic signal.

In operation, the optical amplification system 210 receives an input optical signal through the optical input link 202. The photodiode 220 monitors the input optical signal. The pump laser 214 generates an optical pump signal. In some embodiments, the fiber Bragg grating 216 locks the wavelength of the optical pump signal. The pump laser 214 is controlled with processing circuitry 222 via laser control link 230. The temperature control device 212 is controlled with the processing circuitry 222 via temperature control device link 228.

The multiplexer 218 multiplexes the optical pump signal and the input optical signal to generate a multiplexed optical signal. The multiplexer 218 transmits the multiplexed optical signal into the optical fiber 224. The photodiode 226 monitors the multiplexed optical signal after its transmission through the optical fiber 224.

In some embodiments, the management system 250 receives electrical signals from the photodiode 220 and the photodiode 226. The management system 250 also communicates with the temperature control link 232 and the power control link 234. The management system 250 may activate the alarm system 260 if the pump laser current goes above an end-of-life value.

Figure 3:
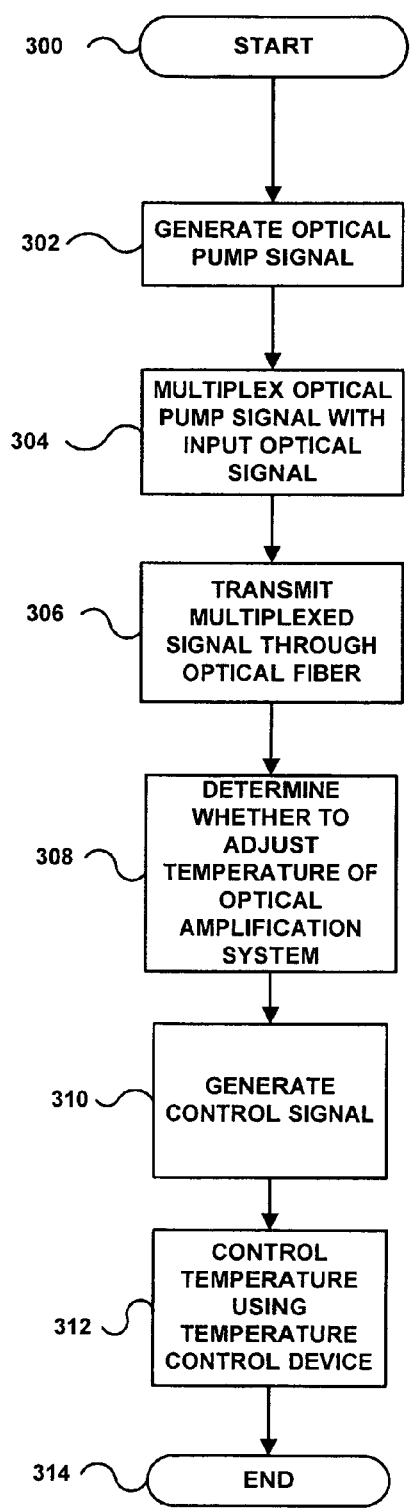
FIG. 3 is a flowchart for operating the optical amplification system in an exemplary embodiment of the invention.

FIG. 3 shows a flowchart for the optical amplification system 210 in an exemplary embodiment of the invention. In some embodiments, the processing circuitry 222 may act in combination with the management system 250, and vice versa, for some steps in FIG. 3. In other embodiments, the management system 250 may substitute for the processing circuitry 222, and vice versa. The control method shown in FIG. 3 may be implemented through manual control of test equipment in some embodiments, or as part of a fully integrated control system in other embodiments. In some embodiments, on any decisions made in the control process, a hysteresis will be applied to ensure that there are no oscillations of the setting of the temperature control device 212.

FIG. 3 begins in step 300. In step 302, the pump laser 214 generates an optical pump signal. In step 304, the multiplexer 218 multiplexes the optical pump signal with the input optical signal. In step 306, the multiplexer 218 transmits the multiplexed signal through the optical fiber 224. In step 308, the processing circuitry 222 determines whether to adjust the temperature of the optical amplification system 210. In step 310, the processing circuitry 222 generates a control signal based on the determination to adjust the temperature of the optical amplification system 210. In step 312, the temperature control device 212 controls the temperature of the optical amplification system 210 based on the control signal. FIG. 3 ends in step 314.

Figure 4:
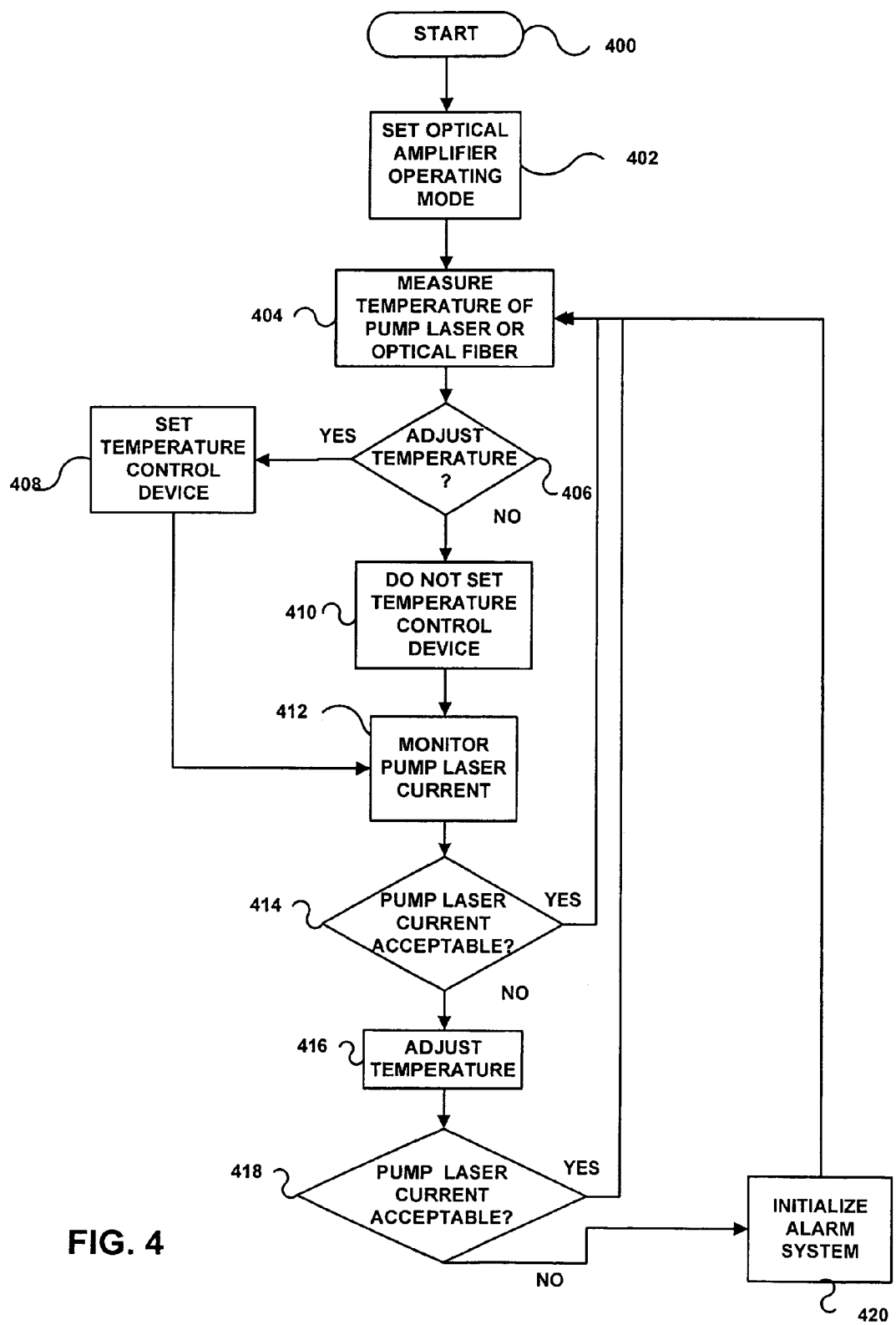
FIG. 4 is a flowchart for temperature control in the optical amplification system in an exemplary embodiment of the invention.

FIG. 4 shows a flowchart for temperature control in the optical amplification system 210 in an exemplary embodiment of the invention. In some embodiments, the processing circuitry 222 may act in combination with the management system 250, and vice versa, for some steps in FIG. 4. In other embodiments, the management system 250 may substitute for the processing circuitry 222, and vice versa. The control method shown in FIG. 4 may be implemented through manual control of test equipment in some embodiments, or as part of a fully integrated control system in other embodiments. In some embodiments, on any decisions made in the control process, a hysteresis will be applied to ensure that there are no oscillations of pump laser current or the setting of the temperature control device 212.

FIG. 4 begins in step 400. In step 402, the management system 250 sets the optical amplifier operating mode, which in some embodiments may be either automatic power control, or automatic gain control, or constant pump power. In step 404, the processing circuitry 222 measures the temperature of the pump laser 214 or the optical fiber 224. The processing circuitry 222 then determines whether to adjust the temperature in step 406. If the temperature needs to be adjusted, the processing circuitry 222 sets the temperature control device 212 in step 408. In step 410, the processing circuitry 222 does not set the temperature control device 212 if the temperature does not need to be adjusted. The processing circuitry 222 then monitors the pump laser current in step 412.

In step 414, the processing circuitry 222 determines whether the pump laser current is at an acceptable value. If the pump laser current is at an acceptable value, the processing circuitry 222 then returns to step 404. In step 416, if the pump laser current is not acceptable, the processing circuitry 222 will adjust the temperature control device 212. In step 418, the processing circuitry 222 then determines again whether the pump laser current is acceptable. If the pump laser current is acceptable, the process returns to step 404. If the pump laser current is still not acceptable, the management system 250 initializes the alarm system 260 in step 420 and returns to step 404.

Figure 5:
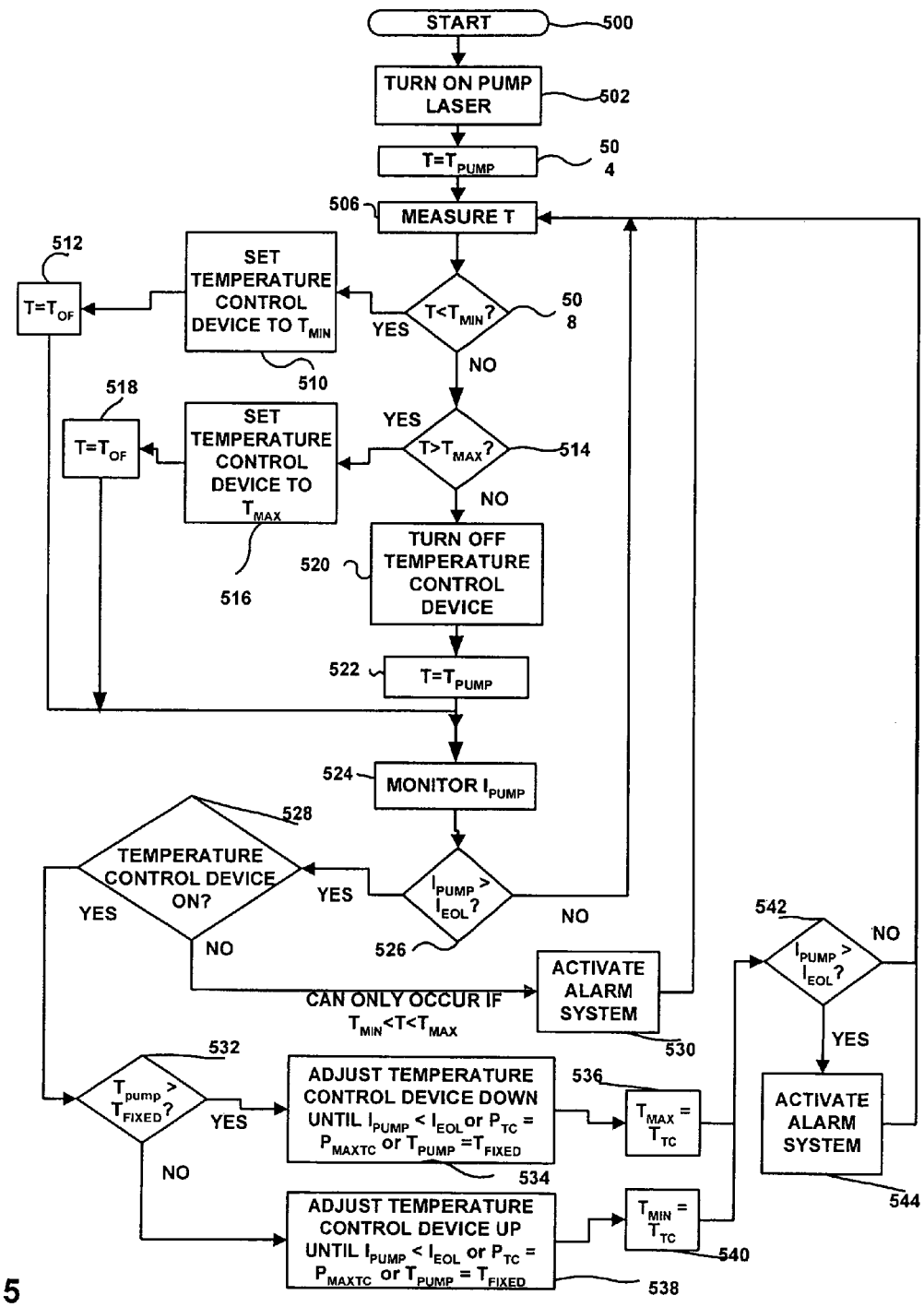
FIG. 5 is a flowchart for temperature control and alarm system activation in the optical amplification system in an exemplary embodiment of the invention.

FIG. 5 shows a flowchart for temperature control and alarm system activation in the optical amplification system 210 for an exemplary embodiment of the invention. In some embodiments, the processing circuitry 222 may act in combination with the management system 250, and vice versa, for some steps in FIG. 5. In other embodiments, the management system 250 may substitute for the processing circuitry 222, and vice versa. The control method shown in FIG. 5 may be implemented through manual control of test equipment in some embodiments, or as part of a fully integrated control system in other embodiments. In some embodiments, on any decisions made in the control process, a hysteresis will be applied to ensure that there are no oscillations of pump laser current, temperature control device state, or target temperature control device setting.

FIG. 5 starts in step 500. The management system 250 turns on the pump laser 214 in step 502. In step 504, the measured temperature equals the pump temperature as measured through a thermistor integrated into the pump laser 214. In step 506, the processing circuitry 222 measures the temperature of the pump laser 214 or the optical fiber 224, depending on whether or not the temperature control device 212 is ON or OFF.

In steps 508–520, the management system 250 determines whether the temperature control device 212 needs to be ON or OFF, and the ideal setpoint for the temperature. In step 508, the management system 250 determines whether the measured temperature T is less than a minimum temperature, $T_{min}$, at which the pump laser 214 can operate without the temperature control device 212. If the measured temperature T is less than $T_{min}$, the management system 250 sets the temperature control device 212 to $T_{min}$ in step 510. In step 512, the processing circuitry 222 measures temperature of the optical fiber 224, $T_{OF}$, and proceeds to step 522.

If the measured temperature T from step 506 is greater than $T_{min}$, the management system 250 compares the measured temperature T to the maximum temperature, $T_{max}$, at which the pump laser 214 can operate with the temperature control device 212 in step 514. If the measured temperature T from step 506 is greater than $T_{max}$, the management system 250 sets the temperature control device 212 to $T_{max}$ in step 516. In step 518, the processing circuitry 222 measures the temperature of the optical fiber 224, $T_{OF}$, and proceeds to step 522.

If the measured temperature T from step 506 is between $T_{min}$ and $T_{max}$, the processing circuitry 222 turns the temperature control device 212 OFF in step 520 and proceeds to step 522.

In step 522, the processing circuitry 222 measures the temperature of the pump laser 214, $T_{pump}$. In step 524, the management system 250 monitors pump laser current, $I_{PUMP}$. In step 526, the management system 250 determines whether the pump laser current, $I_{PUMP}$, has reached an end-of-life value, $I_{EOL}$. If the pump laser current $I_{PUMP}$ is less than the end-of-life value $I_{EOL}$, the management system 250 returns to measuring temperature in step 506. If the pump laser current $I_{PUMP}$ is greater than the end-of-life value $I_{EOL}$, the management system 250 checks to see whether the temperature control device 212 is ON in step 528. If the temperature control device 212 is not ON, the management system 250 activates the alarm system 260 in step 530, and returns to step 506.

In step 532, if the temperature control device 212 is ON, the management system 250 determines whether temperature of the pump laser 214 $T_{PUMP}$ is greater than a fixed temperature of operation $T_{FIXED}$, e.g. 25° C. In steps 534–540, the management system 250 adjusts the temperature control device 212 to bring the pump laser current $I_{PUMP}$ down. If the temperature of the pump laser 214 $T_{PUMP}$ is greater than a fixed temperature of operation $T_{FIXED}$, in step 534 the management system 250 adjusts the temperature control device 212 down until the pump laser current $I_{PUMP}$ is less than the end-of life value $I_{EOL}$ or the power drawn by the temperature control device 212 $P_{TC}$ is equivalent to the maximum allowable power consumption $P_{MAXTC}$ by the temperature control device 212 or the temperature of the pump laser 214 $T_{PUMP}$ is equivalent to the fixed temperature of operation $T_{FIXED}$. In step 536, the management system 250 changes $T_{MAX}$ to be identical to the current value of $T_{PUMP}$.

In step 538, the temperature of the pump laser 214 $T_{PUMP}$ is less than a fixed temperature of operation $T_{FIXED}$. In step 538, the management system 250 adjusts the temperature control device 212 up until the pump laser current $I_{PUMP}$ is less than the end-of life-value $I_{EOL}$ or the power $P_{TC}$ drawn by the temperature control device 212 is equivalent to the maximum allowable power consumption, $P_{MAXTC}$, by the temperature control device 212 or the temperature of the pump laser 214 $T_{PUMP}$ is equivalent to the fixed temperature of operation $T_{FIXED}$. In step 540, the management system 250 changes $T_{MIN}$ to be identical to the current value of $T_{PUMP}$.

In step 542, the management system 250 compares the pump laser current $I_{PUMP}$ with the end-of-life value $I_{EOL}$. If the pump laser current $I_{PUMP}$ is greater than the end-of-life value $I_{EOL}$, in step 544 the management system 250 activates the alarm system 260 and returns to step 506. If the pump laser current $I_{PUMP}$ is less than the end-of-life value $I_{EOL}$, the management system 250 returns to step 506.

Figure 6:
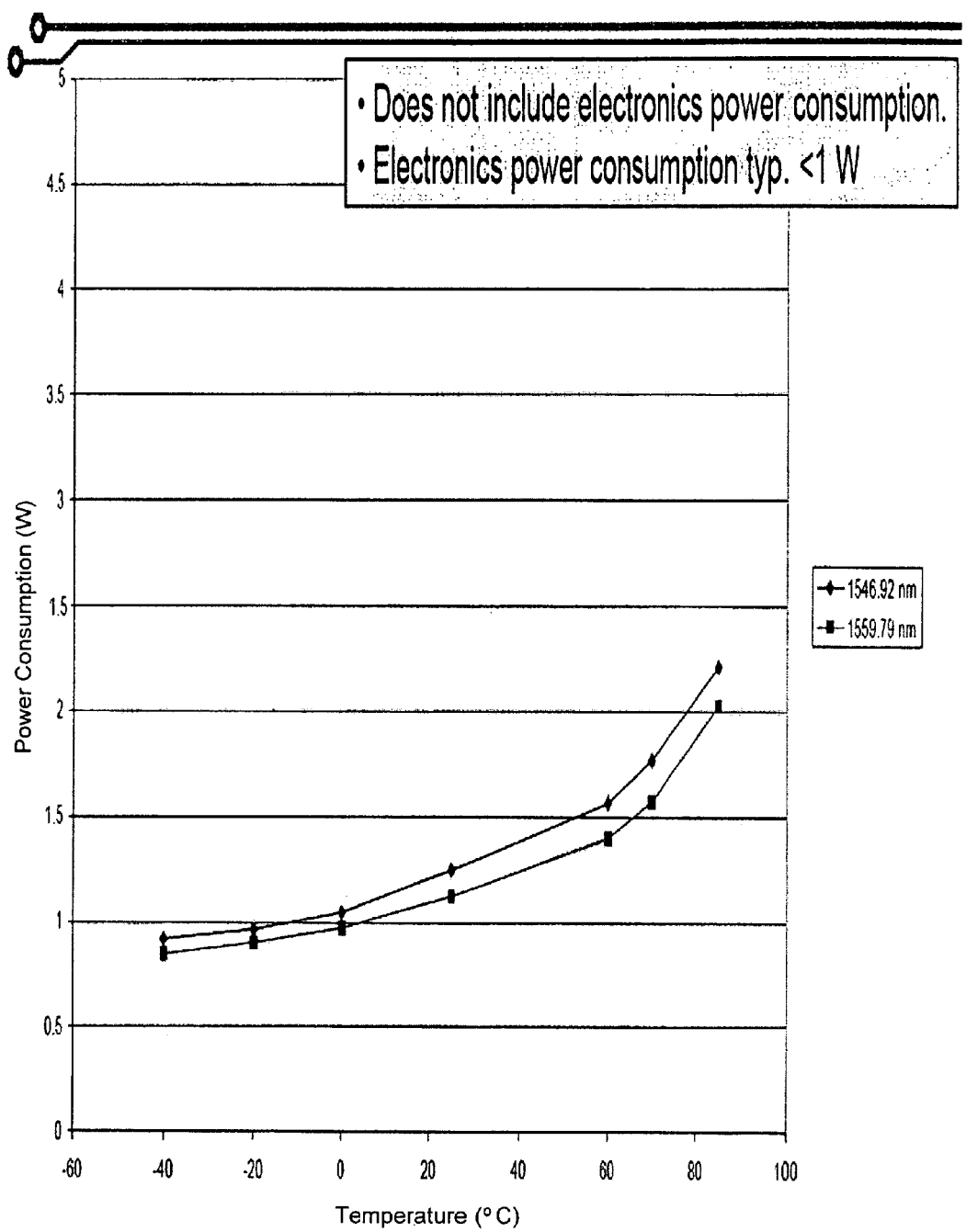
FIG. 6 is a graph of temperature versus power consumption in an exemplary embodiment of the invention.

FIG. 6 shows a graph of temperature vs. power consumption in an exemplary embodiment of the invention. The graph shows a limitation of power consumption below a threshold by the optical amplification system 210, even when operating over a range of temperatures. In a specific embodiment, the power consumption remains under 2.5 Watts over a temperature range from −40° C. to +85° C. (under 3.5 Watts when electronics power consumption is included).

Figure 7:
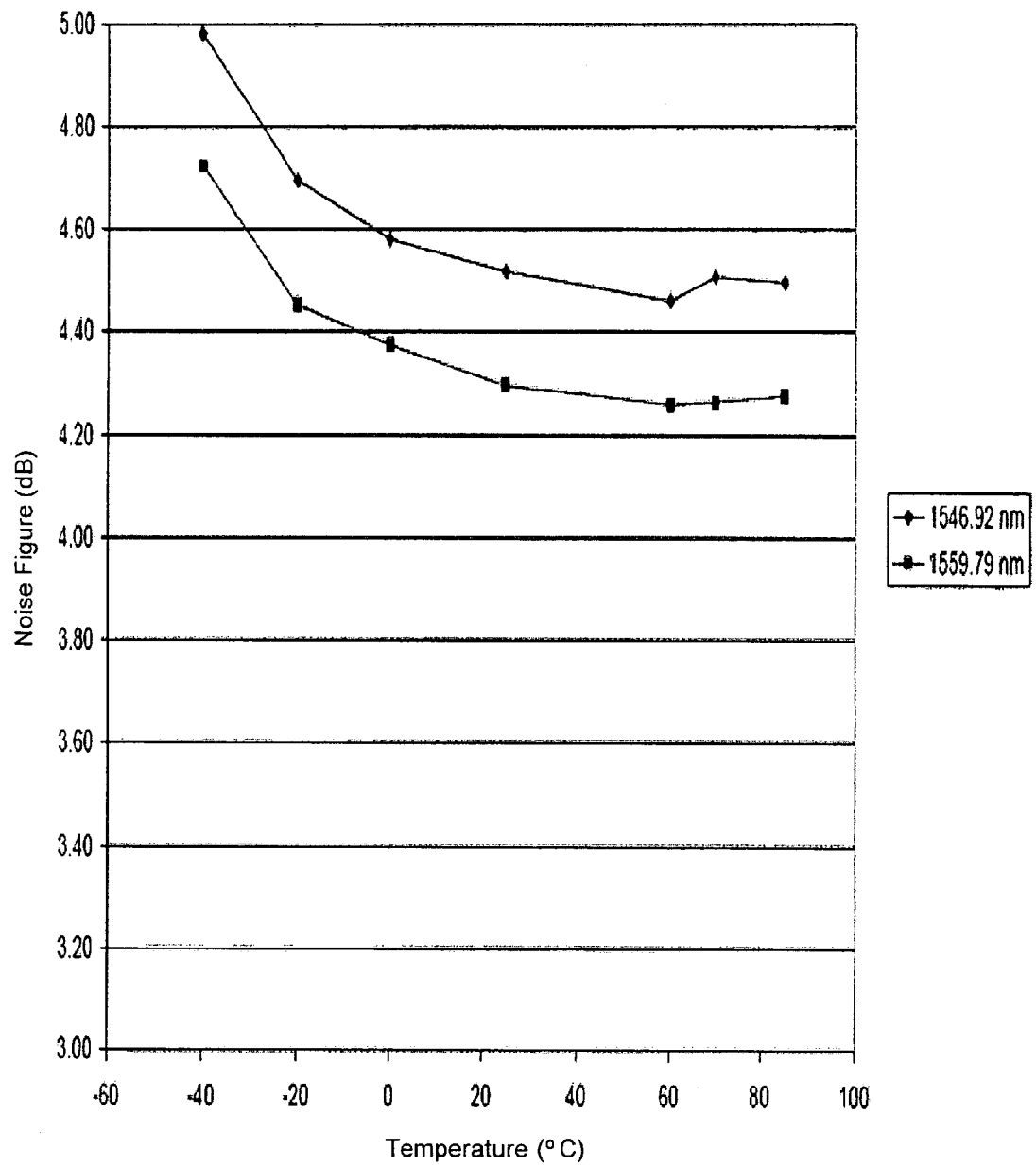
FIG. 7 is a graph of temperature versus noise figure in an exemplary embodiment of the invention.

FIG. 7 shows a graph of temperature versus noise figure in an exemplary embodiment of the invention. The graph shows a limitation of noise under a threshold by the optical amplification system 210, even when operating over a range of temperatures. In a specific embodiment, the noise figure remains under 5 dB over a temperature range from −40° C. to +85° C.

An advantage of the invention is that the temperature inside an optical amplification system can be dynamically controlled, instead of being at ambient temperature or a fixed temperature. In some embodiments, the output optical power and the noise figure can be maintained over a wide range of temperatures while simultaneously keeping power consumption below a threshold. In some embodiments, standard thermoelectric coolers may be used to allow the optical amplification system to operate over a wide range of temperatures while maintaining the optical output power and the noise figure and low power consumption.

In some embodiments, the optical amplification system can operate in several different modes, e.g. controlling power, controlling gain, or maintaining constant pump laser power. Some embodiments of the invention may incorporate rare earth doped fibers, or erbium doped fibers, to act as amplifiers. In some embodiments, control of the optical amplification system can be implemented in different ways, e.g. manual control or totally automated. In some embodiments, the optical amplification system can be used in different fields, e.g. defense, aerospace, or outside-plant telecommunications.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. An optical amplification system comprising:
   a pump laser configured to generate an optical pump signal;
   a multiplexer configured to multiplex the optical pump signal and an input optical signal to generate a multiplexed optical signal;
   an optical fiber configured to receive the multiplexed optical signal;
   a temperature control device configured to control temperature within the optical amplification system based on a control signal;
   processing circuitry configured to determine whether to adjust the temperature of the optical amplification system and configured to generate the control signal based on this determination;
   a fiber Bragg grating (FBG) coupled to the pump laser and configured to lock the wavelength of the optical pump signal from the pump laser into the multiplexer.

2. The optical amplification system of claim 1 wherein the optical amplification system is capable of operating at less than 0° C.

3. The optical amplification system of claim 1 wherein the optical amplification system is capable of operating at greater than 70° C.

4. The optical amplification system of claim 1 wherein the temperature control device comprises a thermoelectric cooler.

5. The optical amplification system of claim 1 wherein the temperature control device comprises a resistive heater.

6. The optical amplification system of claim 1 wherein the temperature control device may be turned ON or OFF.

7. The optical amplification system of claim 1 wherein the processing circuitry is further configured to monitor drive current of the pump laser.

8. The optical amplification system of claim 1 wherein the processing circuitry is further configured to monitor gain of the optical amplification system.

9. The optical amplification system of claim 1 wherein the processing circuitry is further configured to monitor power consumption of the optical amplification system.

10. The optical amplification system of claim 9 wherein the processing circuitry is further configured to monitor power consumption by the pump laser.

11. The optical amplification system of claim 1 wherein the processing circuitry is further configured to maintain total power consumption of the optical amplification system below a power threshold.

12. The optical amplification system of claim 1 further comprising a management system.

13. The optical amplification system of claim 12 further comprising a processor coupled with the management system.

14. The optical amplification system of claim 12 further comprising an alarm system coupled with the management system.

15. The optical amplification system of claim 12 wherein the management system is further configured to monitor drive current of the pump laser.

16. The optical amplification system of claim 12 wherein the management system is further configured to monitor gain of the optical amplification system.

17. The optical amplification system of claim 12 wherein the management system is further configured to monitor power consumption of the optical amplification system.

18. The optical amplification system of claim 12 wherein the management system is further configured to monitor power consumption by the pump laser.

19. The optical amplification system of claim 12 wherein the management system is further configured to maintain total power consumption of the optical amplification system below a power threshold.

20. The optical amplification system of claim 1 wherein the multiplexed optical signal is wavelength division multiplexed.

21. The optical amplification system of claim 1 wherein the optical fiber is doped with rare earth elements.

22. The optical amplification system of claim 1 wherein the optical fiber is doped with erbium.

23. The optical amplification system of claim 1 wherein the processing circuitry is further configured to adjust the temperature to bring the pump laser current down if the pump laser current is at an end-of-life value.

24. The optical amplification system of claim 1 further comprising an alarm system configured to activate when the pump laser reaches an end-of-life value.

25. The optical amplification system of claim 1 wherein the processing circuitry is further configured to return to monitoring the temperature of the optical amplification system after the control signal has been generated.

26. A method for operating an optical amplification system, the method comprising:
generating an optical pump signal in a pump laser;
multiplexing the optical pump signal and an input optical signal to form a multiplexed optical signal;
transmitting the multiplexed optical signal through an optical fiber;
determining whether to adjust temperature of the optical amplification system;
generating a control signal based on the determination of whether to adjust the temperature of the optical amplification system;
controlling the temperature within the optical amplification system based on the control signal by using a temperature control device;
applying a hysteresis to a decision made in the control process.

27. The method of claim 26 wherein the temperature control device comprises a thermoelectric cooler.

28. The method of claim 26 wherein determining whether to adjust the temperature of the optical amplification system further comprises determining whether to turn the temperature control device ON or OFF.

29. The method of claim 26 further comprising monitoring drive current of the pump laser.

30. The method of claim 26 further comprising monitoring gain of the optical amplification system.

31. The method of claim 26 further comprising monitoring power consumption of the optical amplification system.

32. The method of claim 31 further comprising monitoring power consumption by the pump laser.

33. The method of claim 31 further comprising maintaining total power consumption of the optical amplification system below a power threshold.

34. The method of claim 26 wherein the multiplexed optical signal is wavelength division multiplexed (WDM).

35. The method of claim 26 further comprising locking the wavelength of the optical pump signal with a fiber Bragg grating.

36. The method of claim 26 further comprising transmitting the multiplexed optical signal into a rare earth doped optical fiber.

37. The method of claim 26 further comprising transmitting the multiplexed optical signal into an erbium doped optical fiber.

38. The method of claim 26 further comprising adjusting the temperature to bring pump laser current down if the pump laser current is at an end-of-life value.

39. The method of claim 26 further comprising activating a pump end-of-life (EOL) alarm when pump laser current reaches an end-of-life value.

40. The method of claim 26 further comprising returning to monitor the temperature of the optical amplification system after the temperature has been adjusted.

41. An optical amplification system comprising:
a pump laser configured to generate an optical pump signal;
a multiplexer configured to multiplex the optical pump signal and an input optical signal to generate a multiplexed optical signal;
an optical fiber configured to receive the multiplexed optical signal;
a temperature control device configured to control temperature within the optical amplification system based on a control signal;
processing circuitry configured to determine whether to adjust the temperature of the optical amplification system and configured to generate the control signal based on this determination, and further configured to monitor power consumption of the optical amplification system.

42. The optical amplification system of claim 41 wherein the processing circuitry is further configured to monitor power consumption by the pump laser.

* * * * *